United States Patent [19]

Aoki et al.

[11] 4,369,414
[45] Jan. 18, 1983

[54] HIGH-FREQUENCY INPUT CIRCUIT FOR TWO INPUTS

[75] Inventors: Kazuharu Aoki; Sadao Igarashi, both of Soma, Japan

[73] Assignee: Alps Electric Co. Ltd., Tokyo, Japan

[21] Appl. No.: 212,100

[22] Filed: Dec. 2, 1980

[30] Foreign Application Priority Data

Dec. 10, 1979 [JP]  Japan .......................... 54-170782[U]

[51] Int. Cl.³ .............................................. H03H 7/24
[52] U.S. Cl. .................................. 333/81 R; 307/551; 330/145
[58] Field of Search ....................... 333/81 R; 330/145; 307/551

[56] References Cited

U.S. PATENT DOCUMENTS

| 3,518,585 | 6/1970 | Wilcox | 307/551 X |
| 3,813,602 | 5/1974 | van Dijum et al. | 333/81 R |
| 4,019,160 | 4/1977 | Kam | 330/145 X |
| 4,047,131 | 9/1977 | Ludikhuize | 333/81 R |
| 4,097,827 | 6/1978 | Williams | 333/81 R |

Primary Examiner—John S. Heyman
Attorney, Agent, or Firm—Guy W. Shoup; Gerard F. Dunne

[57] ABSTRACT

A high-frequency input circuit for two inputs has a pair of first and second pi variable attenuation circuits each composed of three P-I-N diodes, some of which are shared by both of the circuits. The P-I-N diodes serve as attenuator elements in the attenuation circuits and also as switching elements for switching between the first and second attenuation circuits.

5 Claims, 1 Drawing Figure

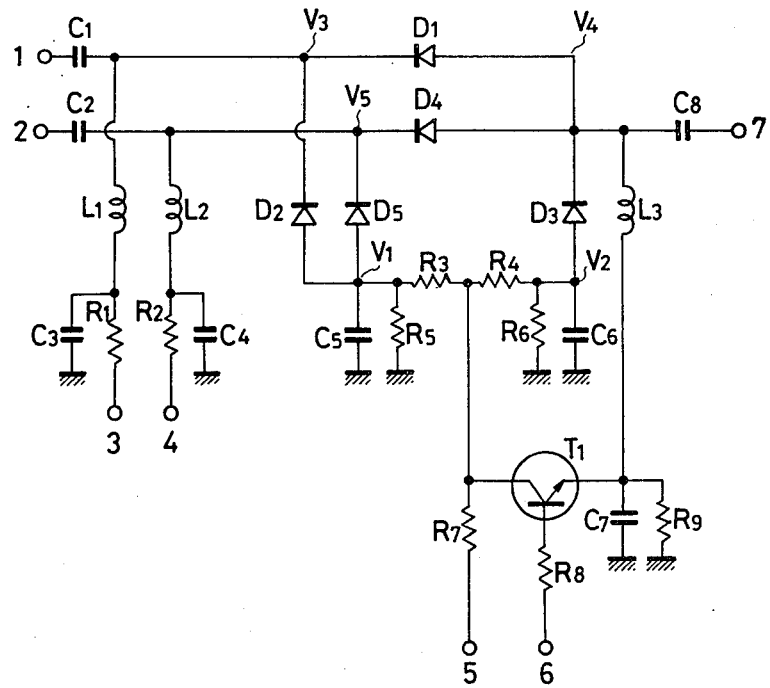

HIGH-FREQUENCY INPUT CIRCUIT FOR TWO INPUTS

BACKGROUND OF THE INVENTION

1. Field of the Invention

The present invention relates to a high-frequency input circuit such as that often used in television tuners, which has a circuit for switching high frequencies and a variable attenuation circuit for controlling the amount of signals transmitted and more particularly to such a high-frequency input circuit including P-I-N diodes which serve as switching elements in the high-frequency switching circuit and also as variable resistance elements for controlling the amount of signal transmission.

2. Prior Art

Conventional high-frequency input circuits for such devices as television tuners have a high-frequency switching circuit between two inputs and a variable attenuation circuit for controlling the amount of input signals transmitted. The switching circuit typically has switching diodes, and the variable attenuation circuit often has P-I-N diodes, with the circuits arranged independently for each input. Accordingly, the number of diodes used is quite large, resulting in a large losses due to diode resistance in the forward direction. The greater the number of diodes, the greater the number of parts necessary for applying bias voltages to the diodes, with the result that the overall circuit arrangement is expensive to construct.

SUMMARY OF THE INVENTION

Accordingly, it is an object of the present invention to provide a high-frequency input circuit for two inputs which is simple in construction.

Another object of the present invention is to provide a high-frequency input circuit for two inputs which is devoid of the traditional switching diodes.

Still another object of the present invention is to provide a high-frequency input circuit for two inputs which has P-I-N diodes that constitute a variable attenuator and serves also as switching diodes.

Still another object of the present invention is to provide a high-frequency input circuit for two inputs which includes a minimum number of diodes with resultant reduced loss of diode resistance in the forward direction.

According to the present invention, a pair of pi variable attenuation circuits each composed of three P-I-N diodes serving as attenuator elements and also as switching elements for switching the attenuation circuits is provided, with some of the P-I-N diodes being shared by the attenuation circuits.

The above and other objects, features and advantages of the present invention will become apparent from the following description when taken in conjunction with the accompanying drawing which shows a preferred embodiment by way of an illustrative example.

BRIEF DESCRIPTION OF THE DRAWING

The sole FIGURE is a circuit diagram of a high-frequency input circuit for two inputs which is constructed in accordance with an embodiment of the present invention.

DESCRIPTION OF THE PREFERRED EMBODIMENT

A high-frequency input circuit illustrated in the drawing comprises a first pi circuit having P-I-N diodes $D_1$, $D_2$ and $D_3$ for controlling input signals from a first input terminal 1, and a second pi circuit having P-I-N diodes $D_4$, $D_5$ and $D_3$ for controlling input signals from a second input terminal 2, the first and second circuits being connected in parallel to each other with the diode $D_3$ shared by both of the circuits. Each of the first and second circuits receives the respective input signals and controls the amount of signal transmitted by signals supplied to SW terminals 3 or 4, a power supply terminal 5 and an AGC (automatic gain control) terminal 6.

With such a circuit arrangement, to allow signals from the first input terminal 1 to pass and to block signals from the second terminal 2, the SW terminal 3 is grounded and voltages such as 15 V, 7 V and 8 V (in the illustrated embodiment) are applied to the SW terminal 4, the AGC terminal 6, and the power supply terminal 5, respectively. As a result, the P-I-N diode $D_1$ is short-circuited, and the P-I-N diodes $D_2$, $D_5$, $D_4$ and $D_3$ are cut off. The input signals from the input terminal 1 are allowed to pass through the P-I-N diode $D_1$ without being attenuated to an output terminal 7, while the input signals from the input terminal 2 are blocked by the P-I-N diode $D_4$.

To variably attenuate the input signals from the input terminal 1, the voltage applied to the AGC terminal 6 is reduced gradually from 7 V with the potentials at the SW terminals 3, 4 and the power supply terminal 5 being left as they are. The voltage at the emitter of a transistor $T_1$, that is, the voltage $V_4$ at the anode of the P-I-N diode $D_1$ is reduced and the current flowing therethrough is likewise reduced, so that the diode $D_1$ has an increased resistance. The diode $D_1$ is now shifted from the condition in which it is short-circuited to the condition in which it is conductive. As the voltage at the AGC terminal 6 is lowered, the emitter voltage of the transistor $T_1$, that is, the anode voltage $V_4$ and cathode voltage $V_3$ of the P-I-N diode $D_1$ are lowered until they are below the bleeder voltage formed by resistors $R_5$, $R_3$, $R_4$, $R_6$ and $R_7$, that is, the anode voltages $V_1$ and $V_2$ of the P-I-N diodes $D_2$ and $D_3$, whereupon the latter are shifted from the cut-off to the conductive condition with their resistances being gradually reduced.

Thus, the input signals from the input terminal 1 can be attenuated as desired by the voltage applied to the AGC terminal 6. During this time, the P-I-N diodes $D_5$ and $D_4$ remain cut off regardless of the AGC voltage.

To allow the signals from the second input terminal 2 to pass and to block the signals from the input terminal 1, the SW terminal 4 is grounded and voltages such as 15 V, 7 V and 8 V are applied respectively to the SW terminal 3, the AGC terminal 6 and the power supply terminal 5. As a result, the P-I-N diode $D_4$ is short-circuited, and the P-I-N diodes $D_2$, $D_5$, $D_3$ and $D_1$ are cut off. The input signals from the input terminal 2 are allowed to pass through the P-I-N diode $D_4$ without being attenuated to the output terminal 7, while the input signals from the input terminal 1 are blocked by the P-I-N diode $D_1$.

To attenuate the input signals from the input terminal 2, the voltage at the AGC terminal 6 is lowered gradually from 7 V with the potentials at the SW terminals 3, 4 and the power supply terminal 5 remaining as they are. The voltage at the emitter of the transistor $T_1$, that is, the anode voltage $V_4$ of the P-I-N diode $D_4$ is reduced and the current flowing therethrough is likewise reduced, so that the diode $D_4$ has an increased resistance and is now shifted from the condition in which it is conductive. As the voltage at the AGC terminal 6 is lowered, the emitter voltage of the transistor $T_1$, that is, the anode voltage $V_4$ and cathode voltage $V_5$ of the P-I-N diode $D_4$ are lowered until they are below the bleeder voltage formed by the resistors $R_5$, $R_3$, $R_4$, $R_6$ and $R_7$, that is, the anode voltages $V_2$ and $V_1$ of the P-I-N diodes $D_3$ and $D_5$, whereupon the P-I-N diodes $D_3$ and $D_5$ are shifted from the cut-off to the conductive condition with their resistances being reduced. Thus, the input signals from the input terminal 2 can be attenuated as desired by the voltage applied to the AGC terminal 6. During this time, P-I-N diodes $D_2$ and $D_1$ remain cut off regardless of the AGC voltage.

In the drawing, the capacitors designated at $C_1$–$C_8$ are coupling capacitors and bypass capacitors, the resistors $R_1$–$R_9$ are current-setting resistors and bias resistors, and $L_1$–$L_3$ designates choke coils.

Representative values for the parts illustrated in the drawing are as follows:

$D_1$–$D_5$: 1SV82 (TOSHIBA)
$T_1$: 2SC1622 (NEC)
$C_1$–$C_8$: 1 (nF)
$R_1$,$R_2$: 330 ($\Omega$)
$R_3$: 400 ($\Omega$)
$R_4$: 500 ($\Omega$)
$R_5$,$R_6$: 1.2 (K$\Omega$)
$R_7$: 150 ($\Omega$)
$R_8$: 3.3 (K$\Omega$)
$R_9$: 470 ($\Omega$)

With the arrangement according to the present invention, only one P-I-N diode $D_1$ or $D_4$ is inserted at a time in a signal transmission path, reducing a loss due to diode resistance connected in series. With a minimized loss, the HF input circuit of the present invention finds effective use for VHF, UHF and higher frequency bands.

What is claimed is:

1. A high-frequency input circuit for two inputs, comprising:
    a first input terminal for receiving a high-frequency input signal;
    a second input terminal for receiving another high-frequency input signal;
    a common output terminal;
    a first pi attenuation circuit connected between said first input terminal and said common output terminal and composed of first, second and third P-I-N diodes;
    a second pi attenuation circuit connected between said second input terminal and said common output terminal and composed of fourth, fifth and said third P-I-N diodes;
    switching means connected between said first and second input terminals for selectively rendering said first and second pi attenuation circuits conductive;
    means connected between branches of said first and second pi attenuation circuits for supplying the circuits with a bias voltage; and
    means connected to said common output terminal for supplying a variable voltage for controlling the degree of attenuation of the signals in said first and second pi attenuation circuits.

2. A high-frequency input circuit according to claim 1, said first P-I-N diode having a cathode connected to said first input terminal and an anode connected to said output terminal, said second P-I-N diode having a cathode connected to said first input terminal and an anode connected to said bias-voltage supplying means, said third P-I-N diode having a cathode connected to said output terminal and an anode connected to said bias-voltage supplying means, said fourth P-I-N diode having a cathode connected to said second input terminal and an anode connected to said output terminal, and said fifth P-I-N diode having a cathode connected to said second input terminal and an anode connected to said bias-voltage supplying means.

3. A high-frequency input circuit according to claim 2, said bias-voltage supplying means comprising:
    first and second resistors connected in series between said anodes of said second and fifth P-I-N diodes and said anode of said third P-I-N diode;
    a third resistor connected between said anodes of said second and fifth P-I-N diodes and the ground;
    a fourth resistor connected between said anode of said third P-I-N diode and the ground; and
    means for supplying a d.c. voltage to a point where said first and second resistors are connected together.

4. A high-frequency input circuit according to claim 1, said variable-voltage supplying means being arranged for being controlled by an AGC (automatic gain control) voltage.

5. A high-frequency input circuit according to claim 4, said variable-voltage supplying means including a transistor having a collector electrode to which a fixed bias voltage is applicable, an emitter electrode grounded via a resistor and connected via a choke coil to said output terminal, and a base electrode to which said AGC voltage is applicable.

* * * * *